United States Patent [19]
Miura et al.

[11] Patent Number: 5,240,762
[45] Date of Patent: Aug. 31, 1993

[54] ORGANIC THIN FILM ELEMENT

[75] Inventors: Akira Miura, Toride; Nobuhiro Gemma, Yokohama; Toshio Nakayama, Fujisawa; Shun Egusa; Makoto Azuma, both of Yokohama, all of Japan

[73] Assignee: Kabushiki Kaisha Toshiba, Kawasaki, Japan

[21] Appl. No.: 766,409

[22] Filed: Sep. 27, 1991

[30] Foreign Application Priority Data

Sep. 28, 1990 [JP] Japan ................................. 2-259016

[51] Int. Cl.$^5$ ................................................ B23B 9/00
[52] U.S. Cl. ................................ 428/220; 428/333; 365/118; 365/119; 365/106; 359/240; 359/245; 359/265
[58] Field of Search .................... 365/106, 118, 119; 350/355, 356, 357; 428/220, 333

[56] References Cited

U.S. PATENT DOCUMENTS

| | | | |
|---|---|---|---|
| 4,371,883 | 2/1983 | Potember et al. | 357/8 |
| 4,574,366 | 3/1986 | Potember et al. | 365/153 |
| 4,819,210 | 4/1989 | Miura et al. | 365/106 |
| 4,871,236 | 10/1989 | Gemma et al. | 350/355 |

OTHER PUBLICATIONS

Physical Review Letters, vol. 63, No. 21, pp. 2405-2408, Nov. 20, 1989, Y. Tokura, et al., "Domain-Wall Dynamics in Organic Charge-Transfer Compounds with One-Dimensional Ferroelectricity".

Primary Examiner—Patrick J. Ryan
Assistant Examiner—Cathy Lee
Attorney, Agent, or Firm—Oblon, Spivak, McClelland, Maier & Neustadt

[57] ABSTRACT

An organic thin film element is disclosed which has an organic thin film consisting of a mixed stacked charge-transfer complex of donor and acceptor molecules, wherein the organic thin film is made neutral by forming the mixed stacked charge-transfer complex which is ionic under the bulk state into a thin film.

12 Claims, 7 Drawing Sheets

```
            ┌─ M₂P-TCNQ    100Å ~45
            │  PTZ-TCNQ    100Å ~44
10 CYCLES ──┤      ⋮
            │  M₂P-TCNQ    100Å ~45
            └─ PTZ-TCNQ    100Å ~44
               PVDF         100Å ~43
            ┌─ DAD-TCNQ    100Å ~42
            │  PZ-TCNQ     100Å ~41
10 CYCLES ──┤      ⋮
            │  DAD-TCNQ    100Å ~42
            └─ PZ-TCNQ     100Å ~41
```
F I G. 6
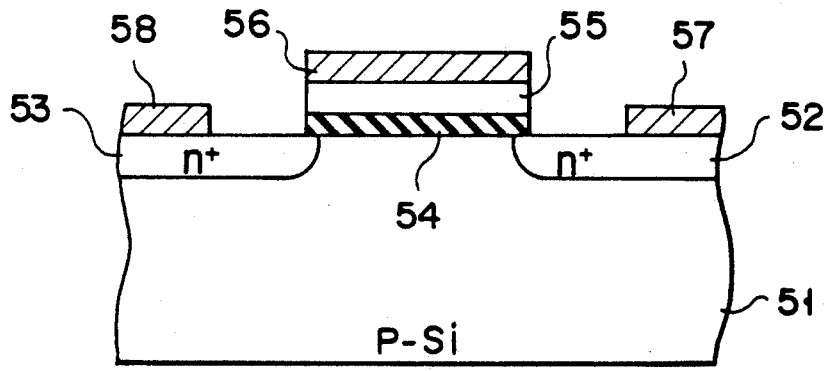
F I G. 7
```
                                    55
               PVDF      50Å  ─ 62
               M₂P-TCNQ  100Å ─ 63
               PVDF      50Å  ─ 62
               M₂P-TCNQ  80Å  ─ 61
```
F I G. 8

ORGANIC THIN FILM ELEMENT

BACKGROUND OF THE INVENTION

1. Field of the Invention

The present invention relates to an organic thin film element.

2. Description of the Related Art

The research has recently been activated to realize elements having novel device functions by using the artificially controlled arrangements of various organic thin films. It is studied to find new photoelectric properties and their applications as electronic and optical elements having sophisticated multifunctionalities, which is required by the future information technology. For example, the studies of organic electroluminescence elements using organic thin films formed by vacuum deposition, and the studies of MIS elements using organic thin films as an insulator formed by the Langmuir-Brodgett technique (hereafter referred to as the LB technique), are well known. However, the research has just begun in view of the evaluation of physicochemical properties of organic films with the thickness less than 1000Å and there are only a few studied examples compared with those of organic materials in bulk phase. Therefore, elements having novel functions and effectively utilizing the properties of organic films have not been realized at present.

From the viewpoint of the application of organic thin films to elements, much attention has been paid to an intermolecular charge transfer phenomenon observed for organic solids. The organic material called a charge-transfer complex includes both donor molecule (D molecule) having a low ionization potential and acceptor molecule (A molecule) having a high electron affinity. These compounds have strong molecular interactions between doner and acceptor molecules, giving rise to a charge-transfered state. For example, a complex consisting of perylene (D molecule) and tetracyanoquinodimethane (TCNQ, A molecule) has a degree of charge transfer of 0.5 or less (neutral). On the other hand, a complex consisting of tetramethylphenylene diamine (TMPD) and TCNQ has a degree of charge transfer of 0.6 or more (ionic) in which each molecule becomes partly positive or negative. Also, a complex consisting of tetrathiafulvalene (TTF and chlorani (CA) is known in which a neutral-ionic phase transition is caused due to a change in temperature or pressure and nonlinear electric response is observed (J. B. Torrance et al.: Phys. Rev. Lett., 46, 253 (1981)).

The reasons for much attention being paid to the charge-transfer complexes are that various combinations between D and A molecules are utilized molecular functions caused by specific charge transfer interactions can be easily designed, and the functions are freely controlled by external energy such as electric field and light.

When the charge-transfer complex is applied to elements, it is important that neutral-ionic transition can easily be caused by an electric field or light. The following are considered as the conditions when the neutral-ionic transition phenomenon is caused by electric field. (A) The difference of energy between the ground state i.e. the neutral state and the excited state i.e. the ionic state should be small. (B) The element structure should be realized so that high electric field can be applied to the charge-transfer complex. To realize the element to meet the condition (B), the following measures are adopted; use of a thin film of the charge-transfer complex not a bulk crystal, forming of an insulating layer between an electrode and the charge-transfer complex so that no current flows through the thin film of the charge-transfer complex, and use of an insulating film with a high relative permitivity.

For measures to realize the condition (A), it is considered to select molecules most suitable for the complex. However, it is difficult to actually realize the condition (A). Discussion for the condition (A) is described in more detail below. The threshold electric field $E_{th}$ where neutral-ionic transition occurs is determined by the following equation.

$$E_I - E_N = eE_{th}d$$

where, e: elementary electric charge,
$E_I$: energy for an ionic state of $D^+ - A^-$,
$E_N$: energy for a neutral state of $D - A$,
D: distance between D and A molecules, approximately ranging from 3.0 to 3.5Å

From the equation, it is found that the smaller the energy difference between the neutral and ionic states the lower the threshold electric field $E_{th}$. In this case, $E_{th}$ should be lower than breakdown field strength of the charge-transfer complex film or that of the insulating layer. It is actually preferable that the value is kept at 2 to $3 \times 10^6$ V/cm or less. Therefore, it is preferable that the value meets the following inequality.

$$E_I - E_N < 0.1 \text{ eV}$$

The charge-transfer complex having a small value of "$E_I - E_N$" includes one in which transition from neutral to ionic state is caused due to application of pressure or decrease of temperature and the other of which charge-transfer absorption band is present at the wave-length of 0.8 μm or more. Specifically, the following charge-transfer complexes are listed: PTZ-TCNQ, TMDAP-TCNQ, TTF-CA, TTF-fluoranil, dibenzoTTF-TCNQ, DEDMTSeF-dimethylTCNQ, TMDAP-fluoranil, TTF-dichlorobenzoquinone, perylene-tetrafluoroTCNQ, peryene-DDQ, perylene-TCNE, perylene-TCNQ, and perylene-fluoranil.

However, among the above charge transfer complexes only for PTZ—TCNQ and TTF—CA the value "$E_I - E_N$" is approximated to 0.1 eV though it exceeds a little. Therefore, a considerably high electric field of $10^6$ V/cm or more should be required.

SUMMARY OF THE INVENTION

It is an object of the present invention to provide an organic thin-film element in which a transition of a charge-transfer complex from neutral to ionic phase can be easily caused by a low electric field to show various functions.

The organic thin film element according to the present invention comprises an organic thin film consisting of a mixed stacked charge-transfer complex of donor and acceptor organic molecules, wherein the organic thin film is neutralized from ionic state. This can be done by forming of a ultra thin film of the ionic charge-transfer complex under the bulk state.

In the present invention, the thickness of the neutralized organic film is preferably 1,000Å or less, more preferably 200Å or less.

In the organic thin film element of the present invention, the transition of charge-transfer complex from neutral to ionic state can be caused by a low electric field.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a schematic showing the organic thin film layer constituting the display element in Example 4 of the present invention;

FIG. 7 is a schematic showing the basic structure of an FET related to the present invention;

FIG. 8 is a schematic showing the organic thin film layer constituting the FET in Example 5 of the present invention;

DETAILED DESCRIPTION OF THE PREFERRED EMBODIMENTS

Figure 1:
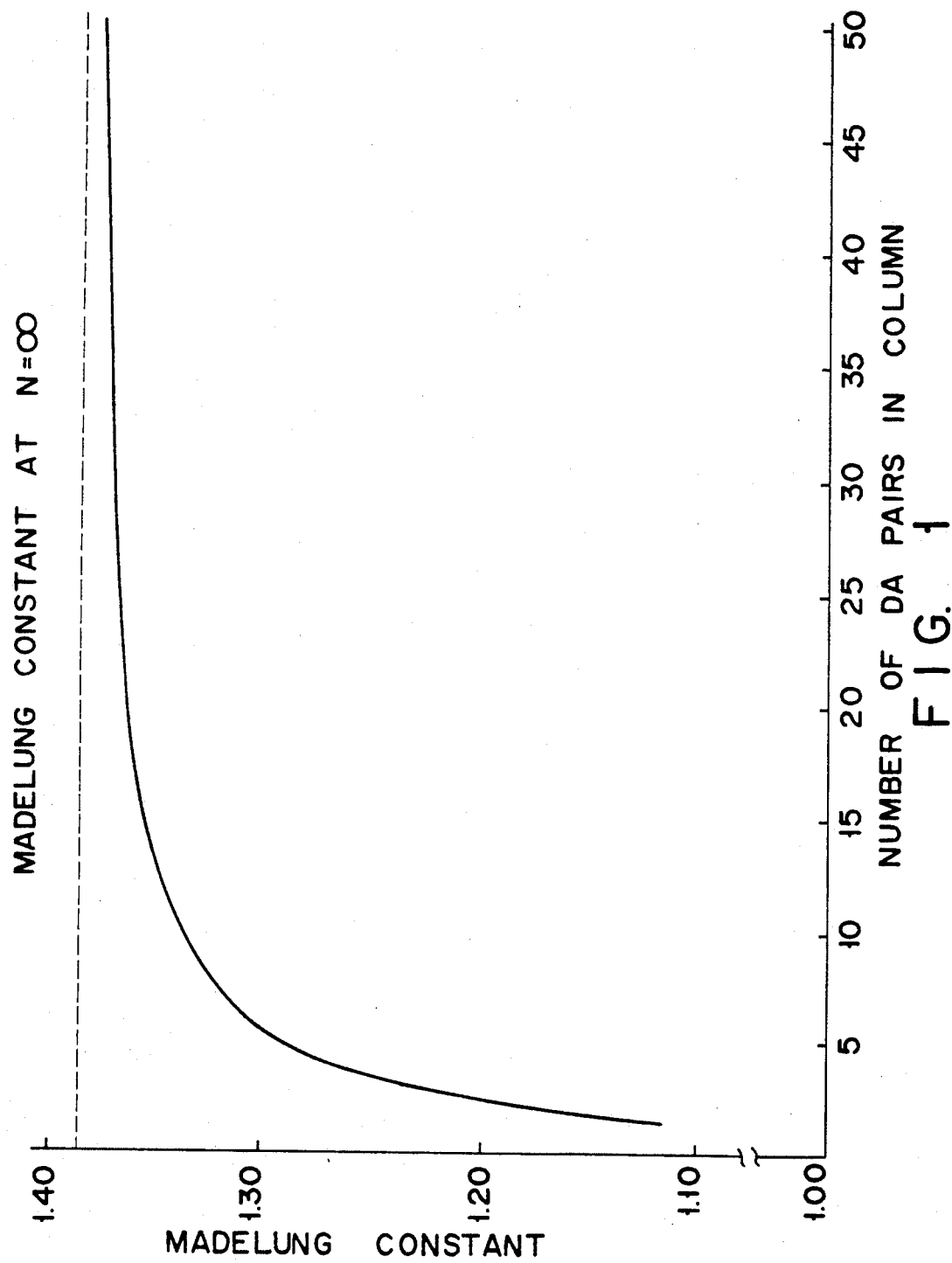
FIG. 1 is a diagram showing the relationship between the number of DA pairs in the column of mixed stacked charge-transfer complex and Madelung constant.

In the present invention, "the bulk state" means powder, a crystal, or a film having a thickness of 1 gm or more. Whether or not an electronic ground state of a complex is ionic under the bulk state is determined by the degree of charge transfer defined by the following equation.

$$E_g = \rho[\eta|E_M| - |I_p - E_A|]$$

where, $\rho$: degree of the charge transfer between D and A molecules, $E_g$: effective DA binding energy, $E_M$: Madelung energy, $I_p$: ionization potential of a D molecule, $E_A$: electron affinity of an A molecule.

The mixed stacked charge-transfer complexes showing ionic characteristic under the bulk state have the degree of charge transfer $\rho$ of 0.5 or more. The inventors found that these complexes have the degree of charge transfer $\rho$ of 0.1 or less and their electronic characteristics become neutral when the complexes are formed into thin films. At the critical film thickness $d^{tr}$ an ionic complex under the bulk state turns to neutral. The film thickness $d^{tr}$, which markedly depends on the type of complex, is 1,000Å or less, and is 200Å or less for most ionic complexes.

The reason why the complex showing ionic characteristic under the bulk state turns to neutra by forming it into a thin film is described below. Here, the difference between the energy $E_I$ of ionic complex and the energy $E_N$ of neutral complex is given by the following equation.

$$E_I - E_N = I_p - E_A - E_M$$

where, $I_p$: ionization potential of a donor molecule, $E_A$: electron affinity of an acceptor molecule, $E_M$: Madelung energy for a pair of ionized $D^+ - A^-$, i.e. Coulomb potential of crystal lattice consisting of $D^+$ ion and $A^-$ ion. Madelun energy $E_M$ is given by the following equation.

$$-E_M = \frac{2}{N} \sum_{i>j} \frac{q_i q_j}{r_{ji}}$$

where, i, j: site of molecule, $q_i$, $q_j$: charge at sites i and j respectively, $r_{ij}$: distance between sites i and j, N: Number of sites.

The value $E_M$ is normally given by the following equation using Madelung constant $\alpha$.

$$E_M = \alpha \cdot \frac{q^2}{d}$$

where, d: minimum D—A distance, q: charge of ionic $D^+$ molecule, which is equal to the absolute value of charge of $A^-$ molecule.

Madelung energy of ionic mixed stacked charge-transfer complex such as TMPD-CA and TMPD-TCNQ is calculated by Metzger et al. (J. Chem. Phys., 57, p. 1876 (1972)). It is shown in the above literature that Madelung energy is 1.30. This value is very close to Madelung constant of 1.38 for one-dimensional infinite chain consisting of positive and negative ions. Therefore, it is estimated that the property of the ionic mixed stacked charge-transfer complex is not affected by interchain interactions of DA columns, but almost determined by the charge transfer interaction within a single D+A− column. In fact, judging from the crystal structure, the same type of molecule and different type of molecule are located at approximately equal distance in a surface vertical to the D+A− columns and the interaction is almost eliminated. Consequently, it is sufficient to consider only one-dimensional D+A− column when the complex is formed into a thin film on the response and property change against external energy such as an electric field.

FIG. 1 shows the relationship between the number of D+A− pairs in a column (corresponding to the thickness of complex thin film) and Madelun energy for a pair of D+A− calculated by the inventors. The distance between D and A molecules ranges between 3.2 and 3.5Å which corresponds to the film thickness of 6.4 to 7.0Å for a pair of D+A−. The intensity of Coulomb interaction between D+ and A− is about 3.0 eV and Madelung constant of 0.1 corresponds to the energy of 0.3 eV. As shown in FIG. 1, even if the number of D+A− pairs increases Medelung constant does not converge into the value of the infinite chain or bulk crystal, which reflecting the long-range effect of Coulomb interaction. The difference of Madelung energy between bulk crystal and thin film is 0.30 eV for 5 pairs (approx. 33Å), 0.15 eV for 10 pairs (approx. 67Å), and 0.10 eV for 15 pairs (approx. 100Å). Even for 45 pairs (approx. 300Å), the difference is 0.03 eV which is still large. Thus, even though ionic characteristic is more stable ($E_I - E_N < 0$) under the bulk state, neutral characteristic becomes more stable ($E_I - E_N < 0$) when the complex is formed into a very thin film because Madelung energy decreases. The film thickness $d^{tr}$ where the mixed stacked charge-transfer complex which is ionic under the bulk state turns to neutral depends on the type of complex as previously mentioned. More specifically, it depends on $I_P$ and $E_A$.

An organic thin film made neutral by forming a complex which is ionic under the bulk state into a thin film (hereafter referred to as a "complex thin film" unless otherwise specified) with a thickness slightly smaller than the film thickness $d^{tr}$ where the complex turns to neutral is caused transition from neutral to ionic state by the electric field of $10^3$ to $10^5$ V/cm which is very low compared with the conventional electric field. It is also possible to give the external energy corresponding to the electric field of $10^3$ to $10^5$ V/cm in the form of a photoelectric field. The external energy necessary for a complex thin film to be caused transition from neutral to ionic state depends on the thickness of thin film and the type of complex. Meanwhile, properties of the complex thin film such as polarization state and absorption wavelength change when the transition from neutral to ionic state is caused by the given external energy. Therefore, it is possible to easily manufacture an organic thin film element having sophisticated functions by considering the external energy necessary for the transition of the complex thin film from neutral to ionic state and the property change of the complex thin film, and using a proper element structure.

When the complex thin film related to the present invention is applied to practical elements, various element structures are adopted. Only one layer of complex thin film may be used in these elements. To obtain a required property change, however, it is preferable that the total thickness of complex thin film is kept within the rang from hundreds to thousands of angstrom. In this case, it is preferable to use a superlattice structure made by repeatedly laminating one or more types of complex thin films and one or more types of thin film made of other organic molecules. An insulating molecule, donor molecule, acceptor molecule, and mixed stacked charge-transfer complex which is neutral under the bulk state are listed as other molecules.

When the superlattice structure is formed, the structure is easily disordered if a molecule whose structure greatly differs from that of the complex is laminated. Therefore, it is preferable to laminate a molecule having a structure similar to the complex so that the film structure is not disordered. Also, when electronic interaction acts between adjacent thin films, the electronic state may be modified compared with the case of complex thin film alone. Therefore, no required function may be obtained unless the complex is combined with other molecules by considering the molecular structure and electronic state of other molecules to be laminated on the complex thin film.

It is the other type of mixed stacked complex that is most similar in the structure to that of the mixed stacked complex which is ionic under the bulk state. However, if a complex which is ionic under the bulk state is used as the other molecule, no neutral thin film is obtained because ionic thin film is entirely formed due to strong interaction between complexes. Therefore, when a complex is used as the other molecule, it is preferable to use the mixed stacked complex which is neutral under the bulk state. A donor or an acceptor molecule may be used as the other molecule suitable for combination with the complex thin film.

Examples of mixed stacked charge-transfer complexes which are ionic under the bulk state will be listed: DAD-TCNQ, DAD-TCNQF$_4$, DAD-MeTCNQ, DAD-DMeTCNQ, DAD-DDQ, DAD-CA, DAD-BA, TMPD-TCNQ, TMPD-MeTCNQ, TMPD-DMeTCNQ, TMPD-DDQ, TMPD-CA, TMPD-BA, PD-TCNQ, PD-DDQ, PD-CA, PD-BA, PTZ-DDQ, N-MePTZ-TCNQ, M$_2$P-TCNQ, M$_2$P-TCNQF$_4$, M$_2$P-DDQ, M$_2$P-TCNE, M$_2$P-CA, M$_2$P-DTF, HMD-TCNQ, TMB-TCNQ, TMB-TCNQF$_4$, TMB-DDQ, and DBTTF-TCNQ. (DAD: diaminodurene, TCNQ: tetracyanoquinodimethane, TCNQF$_4$: tetracyanotetrafluoroquinodimethane, DMeTCNQ: dimethyltetracyanoquinodimethane, DDQ: dichlorodicyanoquinone, CA: chloranil, BA: bromanil, TMPD: tetramethyl-p-phenylene diamine, PD: p-phenylene diamine, PTZ: phenothiazine, N-MePTZ: N-methylphenothiazine, M$_2$P: dimethylphenothiazine, TCNE: tetracyanoethylene, HMD: hexamethyldiaminodurene, TMB: 3,3',5,5'-tetramethylbenzidine, TTF: tetrathiafulvalene, DBTTF: dibenzotetrathiafulvalene).

As shown above, there are many types of mixed stacked charge-transfer complexes which are ionic under the bulk state. All of them turn to neutral by forming them into a thin film, thus materials constituting the element can be selected in a wide range. Examples of the insulating molecule to be laminated on the complex thin film are polyvinylidene fluoride (PVDF), etc. Examples of D or A molecules to be laminated on the complex thin film will be shown in the structural formulas below.

(i) Donor molecules

-continued
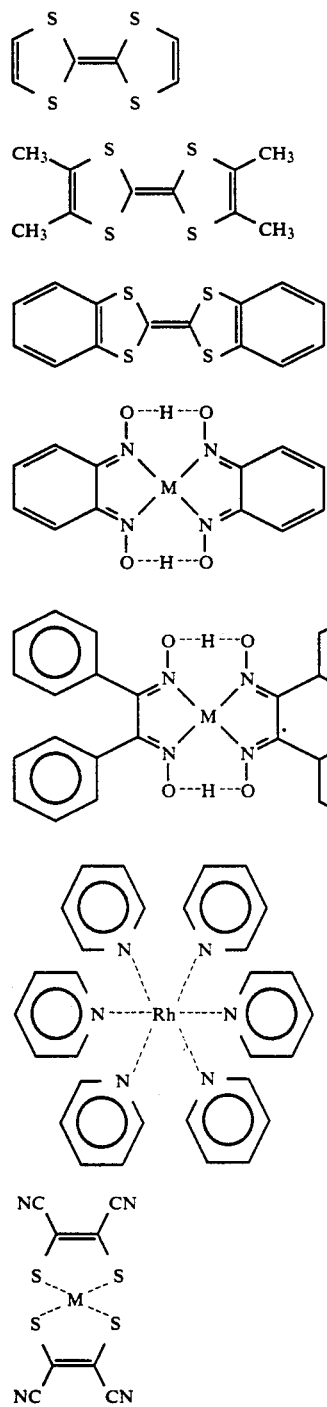
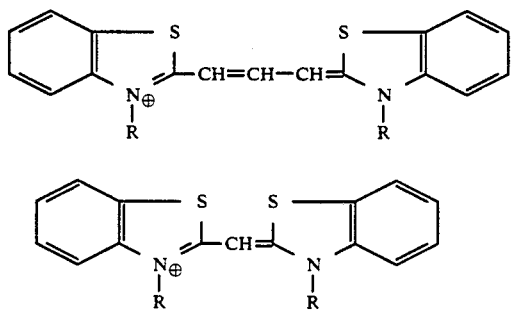
-continued
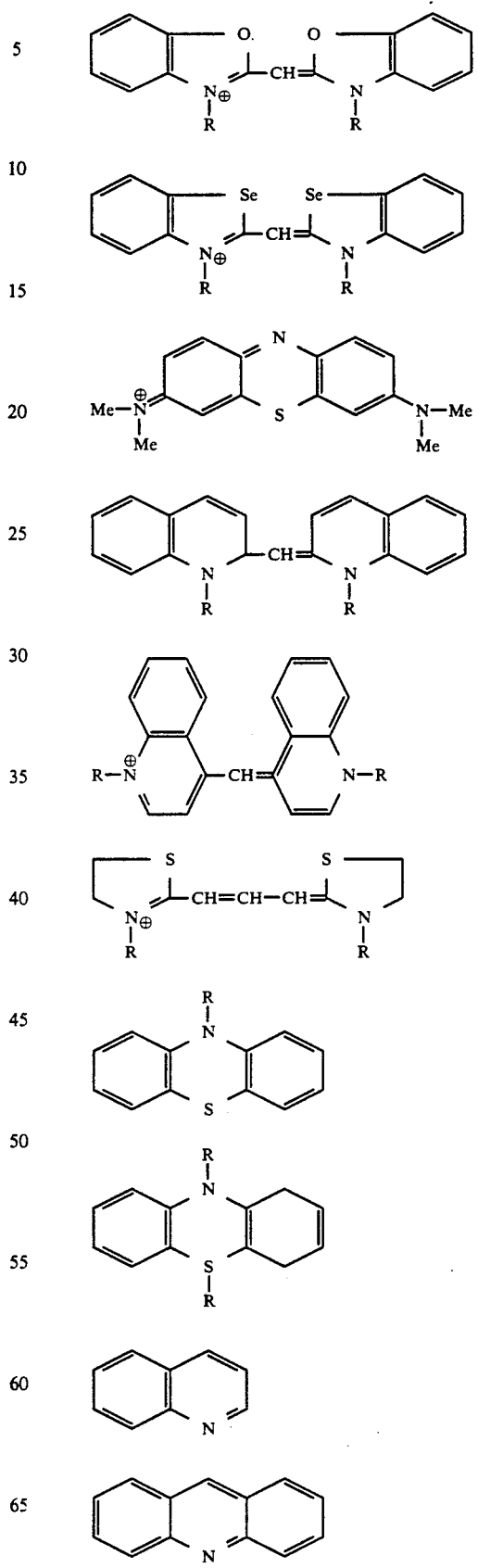

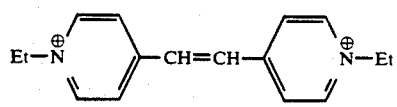
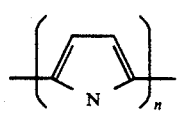
X = O, N, S
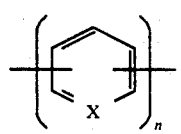
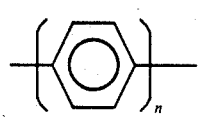
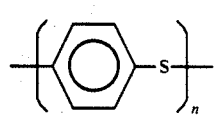
(ii) Acceptor molecules
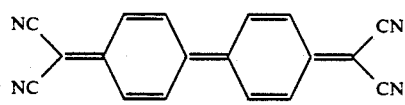
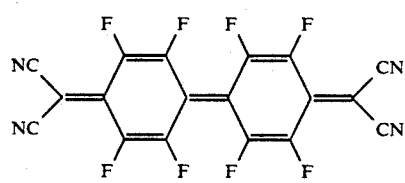
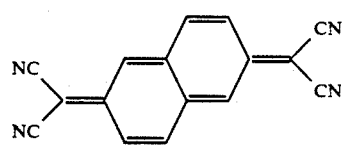
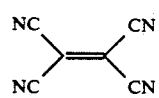
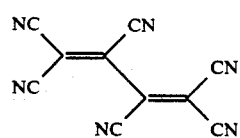
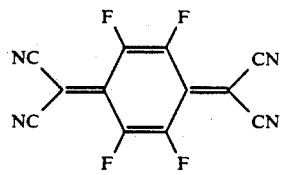
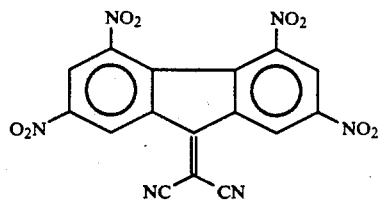
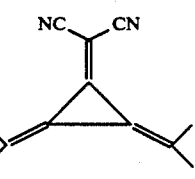
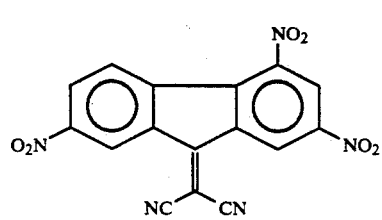
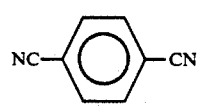
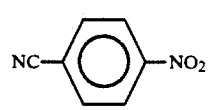
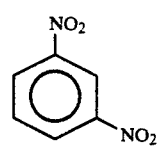
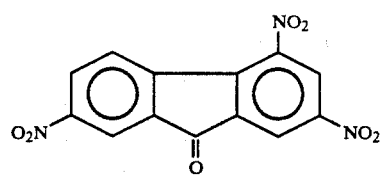
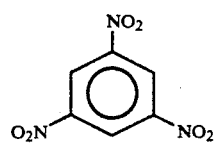
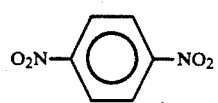
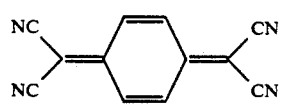

-continued

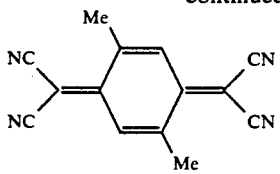

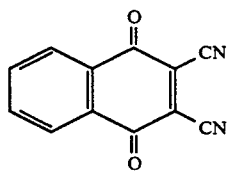

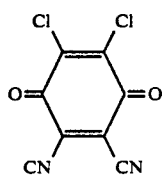

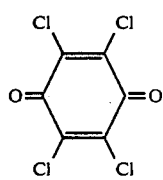

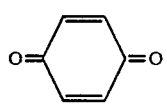

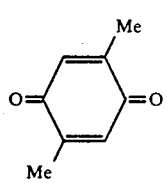

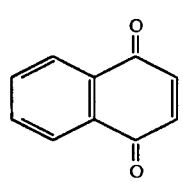

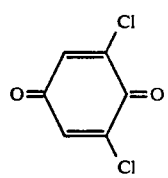

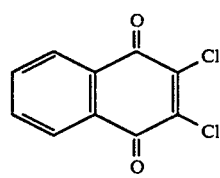

Examples of Mixed stacked charge-transfer complexes which are laminated on the complex thin film and neutral under the bulk state will be listed below.

PTZ-TCNQ, TMDAP-TCNQ, TTF-CA, TTF-fluoranil, DBTTF-TCNQ, DEDMTSeF-DMeTCNQ, TMDAP-fluoranil, TTF-dichlorobenzoquinone, perylene-TCNQF$_4$, perylene-DDQ, perylene-TCNE, perylene-TCNQ, perylene-fluoranil, and PZ-TCNQ.

The structures and operational principles of the organic thin film elements related to the present invention having various functions will be briefly described below.

DISPLAY ELEMENT

The display element has the basic structure made by forming an organic thin film including a complex thin film between a pair of electrodes. An insulating film is generally formed between the electrode and th organic thin film in order to effectively apply an electric field to the organic thin film. The organic thin film consists of the superlattice structure made by repeatedly laminating, for example, complex thin films and insulating thin films. Display function can be obtained from the display element because the transition of the complex thin film from neutral to ionic state is caused and the light absorption waveform of the complex thin film changes by applying an electric field to the organic thin film from the electrodes.

By utilizing a property that the value of $E_I-E_N$ of a complex thin film depends on the film thickness, it is possible to manufacture a display element having multivalued function. This display element includes two or more complex thin film layers having two or more different film thicknesses of $d_1$, $d_2$, etc. Because the value of $E_I-E_N$ in the complex thin film with the thickness of $d_1$ is different from that of $E_T-E_N$ in the complex thin film with the thickness of $d_2$, the intensity of the electric field for transition from neutral to ionic state differs between the two complexes. If $d_1 < d_2 < d''$, the complex thin film with the thickness of $d_2$ is first caused transition from neutral to ionic state by raising the applied voltage and then the complex thin film with the thickness of $d_1$ is also caused transition from neutral to ionic state by further raising the voltage. Thus, the display element responds to multivalued voltages can be realized.

By utilizing a property that the value of $E_I-E_N$ of the complex thin film also depends on the type of the complex, it is possible to manufacture an element having multivalued function. For this display element, two or more complex thin film layers are formed by using two or more types of complexes. Because the value of $E_I-E_N$ in one type of complex thin film is different form that of $E_I-E_N$ in other type of complex thin film, the intensity of the electric field for transition from neutral to ionic state differs between the two complexes. Therefore, one type of complex thin film is first caused transition from neutral to ionic state by raising the applied voltage and then other type of complex thin film is also caused transition from neutral to ionic state by further raising the voltage. Thus, the display element responds to multivalued voltages can be realized.

It is also possible to use a superlattice structure made by laminating a thin film consisting of molecules with different absorption bands for the complex thin film. For the light absorption characteristic, most of complexes which are ionic under the bulk state have the absorption band of 400 to 450 nm and are turn yellow by neutralizing them. When these complexes are ionized by an electric field, they have a strong absorption band in the long wavelength region of 500 to 600 nm or more and turn blue or green. Meanwhile, PTZ-TCNQ or PZ-TCNQ among complexes which are neutral under the bulk state have the broad absorption band of 600 to 700 nm and are kept red brown. Therefore, when the superlattice structure is formed by using these complexes, the display element responds to multivalued voltages can be realized and display color can be selected in a wide range.

FIELD-EFFECT TRANSISTOR (FET)

The FET has the basic structure made by forming a gate insulating film, laminating films including a complex thin film, and forming a gate electrode in order on the channel between the source and drain regions formed on the surface of a semiconductor substrate. In this FET, as slowly raising the voltage applied between the substrate and gate electrode th complex thin film works as only an insulating layer when the complex thin film is neutral, however, a large polarization occurs when the transition of the complex thin film from neutral to ionic state is caused, and the electric field in the complex thin film gets smaller than that before the transition. According to the transition, the potential on the semiconductor surface changes and the carrier density in the channel discontinuously increases. In view of the relationship between the gate voltage and drain current, the drain current suddenly increases at the gate voltage $V_G{''}$ corresponding to the transition of the complex thin film from neutral to ionic state and the switching function from off to on is shown.

The electric field for transition of the complex thin film from neutral to ionic state depends on the thickness and the type of the complex thin film. Therefore, it is possible to realize an FET having the multiple-stage switching function by forming a super lattice structure consisting of complex thin films and insulating thin films and changing the thickness of the complex thin films or the types of the complexes.

PYROELECTRIC ELEMENT

The pyroelectric element has the structure made by forming a complex thin film between a pair of electrodes and is used under the condition in which the complex thin film is polarized by applying a voltage to the complex thin film. To effectively apply the voltage to the complex thin film, it is preferable to form an insulating thin film between the electrode and the complex thin film. For this pyroelectric element, polarized state in the complex thin film can efficiently be realized by the means with very high controllability to apply the voltage to the fim. In addition, because very large dipoles can be formed in a high density in the stacked direction, the polarization ($P=N\Delta\mu/V$) per unit volume also takes a large value. Moreover, because most complexes show a specific charge transfer absorption in the infrared region of 800 nm or more as the result of transition from neutral to ionic state, it is possible to provide a thin film which senses a specific wavelength, depending on the selected complex molecule.

Conventional pyroelectric elements use ferroelectric inorganic crystal or ceramic. However, these materials have disadvantages that it is difficult to form an element with a large area, and the response speed of the element is low because of a large film thickness. Therefore, the wavelength resolution of a bolometer cannot be obtained by, for example, an infrared sensor which is the biggest purpose of the pyroelectric element and the sensor has a low response characteristic. For this reason, these infrared sensors cannot compete with the photoelectric-effect sensor using semiconductor crystal such as HgCdTe. In addition, because inorganic substances with a relatively large pyroelectric coefficient have an excessive heat capacity or permittivity, the sensor performance index resultingly decreases and its application range is greatly restricted.

Meanwhile, piezoelectric materials consisting of an organic polymer such as polyvinylidene fluoride have the pyroelectric coefficient of $3\times10^{-5}$ ° C./cm$^2$ equal to that of inorganic substances and a small heat capacity. Therefore, its application is studied. However, these materials require mechanical processings such as stretching and poling for polarization, creep occurs due to these processings. Therefore, a problem lies in the stability of pyroelectric characteristic. Moreover, to show effective pyroelectricity, the thickness of about 100 μm is necessary. Therefore, it is difficult to apply these materials to an advanced sensing system for detecting infrared radiation a drain current change by combining them with a semiconductor integrated circuit such as an FET or CCD.

On the other hand, the pyroelectric element related to the present invention is able to solve the above problem.

OPTICAL RECORDING ELEMENT

Transition of a complex thin film from neutral to ionic can also be caused by a photoelectric field. When the transition of the complex thin film from neutral to ionic state is caused by an electric field, the surface density of the ionized complex molecule is shown as follows:

$$Q/S = \epsilon\epsilon_0 V/ed$$

Suppose the relative permittivity of the complex thin film is about 50, the value of Q/S comes to about $10^{11}$ electrons/cm$^2$.

The relationship between the light intensity P and the corresponding photoelectric-field intensity E is generally given by the following equation.

$$E = (2P/\epsilon\epsilon_0 S)^{\frac{1}{2}}$$

where, p0 S: beam size.

The photon density $N_p$ per unit time is given as follows:

$$N_p = P(\omega)/\hbar\omega$$

Therefore, The photoelectric field intensity is given as follows:

$$E = (2N_p\cdot h/\epsilon\epsilon_0 S)^{\frac{1}{2}}$$

A laser with a high directivity and monochromaticity is used as a light source for optical recording. For example, when a laser beam with the wavelength of 500 nm, beam diameter of 3 gm, and output of 100 mw is used the photon density Np comes to about $10^{17}$ (photons/sec). Therefore, it is estimated that the photoelectric field intensity is approximately $10^7$ V/cm.

Meanwhile, the transition strength of light absorption by molecules (product of the radiant energy density and Einstein's absorption transition probability ($B_{mm}$)) can be estimated by the oscillator strength (f). The oscillator strength f is experimentally obtained by using the molar absorption coefficient $\epsilon(\nu)$ as follows:

$$f = A^* \int \epsilon(\nu) d\nu$$

where,
$A^*$: constant.

For allowed transition, f is larger than 0.1 and the absorbance of thin film is at least $10^{-2}$ if the molecule absorption coefficient $\epsilon(\nu)$ is about $10^4$ $(M^{-1}cm^{-1})$. Because the density of the photon to be absorbed is about $10^{15}$ (photons/sec), the photoelectric field intensity range between $10^4$ and $10^{15}$ V/cm. This photoelectric field intensity is large enough to optically excite a complex directly and cause the transition from neutral to ionic state.

The optical recording element of the present invention includes a three-layered structure of D/[DA]/A as the recording unit made by sandwiching a complex thin film between a thin film consisting of a donor molecule (D-molecule thin film) and a thin film consisting of an acceptor molecule (A-molecule thin film).

Information is recorded in the optical recording element by intermittently applying a beam with a specific wavelength to the element according to information signals. Information is held by the recording unit of the portion to which the beam is applied according to any one of the following principles. (a) Information is held when the transition of the complex from neutral to ionic state is caused and then charges move to the adjacent D and A molecules. (b) Information is held when D molecule is optically excited, electrons move to A-molecule thin film through the complex thin film, and then D and A molecules are ionized respectively. (c) Information is held when D and A molecules are ionized and the transition of the complex from neutral to ionic state is caused by the action of the polarized field.

The following is the description of how to read the information recorded in the recording element. In the recording unit of the portion to which the beam is applied, the transition of the complex from neutral to ionic state is caused. Because light absorption characteristic of the complex greatly differs in ionic and neutral states, it is possible to easily check whether or not information is recorded. Therefore, information can be read by applying a low-output reference beam and detecting the light transmitted from the complex thin film.

Moreover, it is possible to manufacture a multiple recording element by changing the combination of types of molecules constituting the three-layered structure of D/[DA]/A to compose a plurality of recording units for responding to beams with different specific wavelengths and laminating several stages of the recording units.

Information is recorded in the multiple recording element by using a multiple light source capable of applying a plurality of beams with different wavelengths and intermittently applying the beams to the element through an optical system. Information is held by the recording unit of the portion to which the beam with the corresponding wavelength is applied according to any one of the above principles.

Information is read from the multiple recording element by applying low-output reference beam with a wide wavelength range to the element and detecting the transmitted light by a scanning spectrophotometer. Multiple information recorded in each specific recording portion can simultaneously be read in parallel by the above operation.

The conventional memory media include a semiconductor memory, optical disk, and magnetic disk. The semiconductor memory such as a bipolar RAM is overwhelmingly superior in the access time. Meanwhile, the optical disk has practically been used because it has a low price per bit and a high recording density compared with other memories including the magnetic disk. However, it has many problems to be solved in view of the reloading characteristic and reliability. In addition, in view of the very-high density recording, the recording system in the photon mode is more advantage than that in the heat mode, so that organic photochromic materials have positively been studied. Also the recording technique using novel characteristic phenomenon such as photochemical hole burning (PHB) has actively been studied in recent years. However, the conventional photon-mode recording system using the organic photochromic material has the disadvantage of very poor information holding characteristic because cleavage of intramolecular bond or great structural alternation occurs.

On the other hand, because the optical recording element of the present invention uses transition of the complex thin film from neutral to ionic state and only the charge redistribution occurs between molecules, it is possible to avoid the disadvantage that the holding characteristic is degraded due to bond cleavage which is a problem on the conventional photon-mode recording system.

Examples of the present invention will now be described with reference to drawings.

EXAMPLES 1-4 (DISPLAY ELEMENT)

Figure 2:
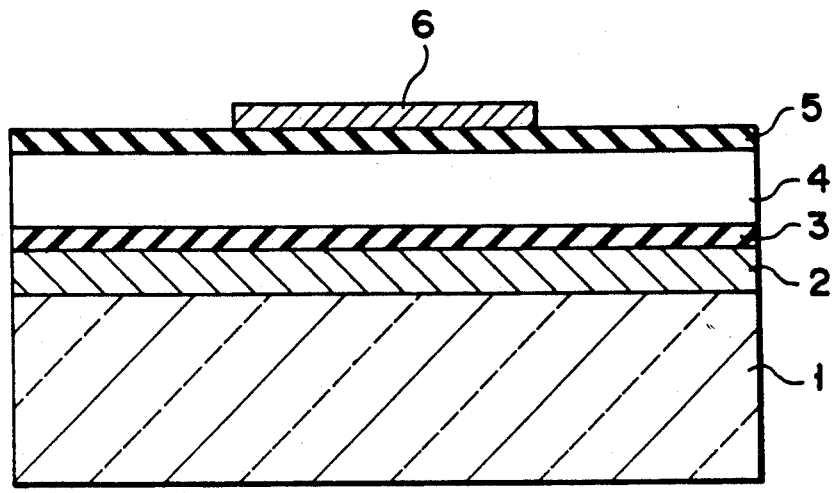
FIG. 2 is a schematic showing the basic structure of a display element related to the present invention.

FIG. 2 is a sectional view of the basic structure of the display element related to the present invention. As shown in FIG. 2, the structure is made by forming an ITO transparent electrode 2 with the film thickness of 4,000Å, a $SrTiO_3$ layer 3 with the film thickness of 2,000Å as an insulating film, an organic thin film layer 4, a polyisobutylmethacrylate (PIBMA) layer 5 with the film thickness of 200Å as an insulating layer, and a translucent Au electrode 6 with the film thickness of 200Å on a quartz glass substrate 1 in order.

The ITO electrode 2 is formed by the sputtering method. The $SrTiO_3$ layer 3 is formed by the sputtering method by keeping the temperature of the quartz glass substrate 1 on which the ITO electrode 2 is formed at 500° C. The organic thin film layer 4 has a superlattice structure made by laminating a plurality of thin films consisting of complex thin films and other molecules, and each thin film constituting the layer is formed by the vacuum deposition method. The PiBMA layer 5 is formed by laminating 20 mono-molecular films with the thickness of 11Å by the LB technique (vertical dipping method). The Au electrode 6 is formed by the vacuum deposition method.

Example 1 (Display Element)

Figure 3:
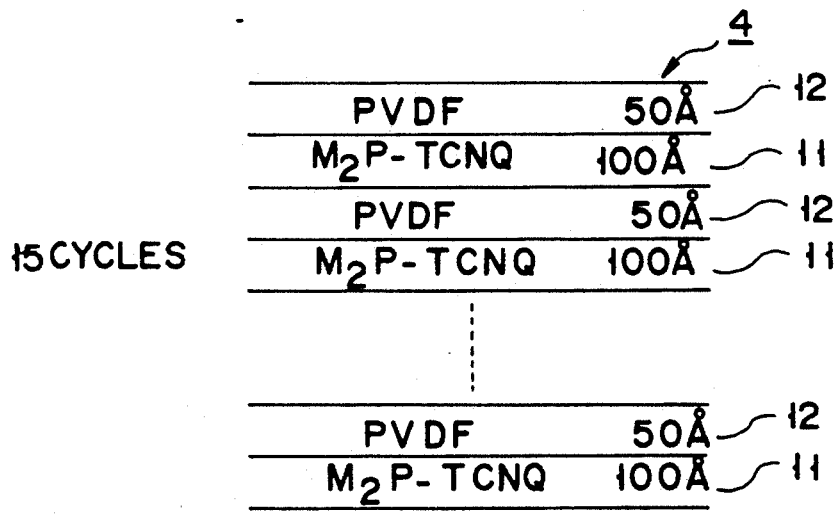
FIG. 3 is a schematic showing an organic thin film layer constituting the display element in Example 1 of the present invention.

For the display element in this example, the organic thin film layer 4 in FIG. 2 consists of a superlattice made by repeatedly laminating an $M_2P$-TCNQ thin film 11 with the thickness of 100Å and a polyvinylidene fluoride (PVDF) thin film 12 with the thickness of 50Å by turns up to 15 cycles and its total thickness is 2,250Å as shown in FIG. 3.

The element shows the following colors according to the applied voltage $V_{ap}$.

Yellow for $V_{ap} < 5V$
Black purple for $V_{ap} \geq 5V$.

Example 2 (Display Element)

Figure 4:
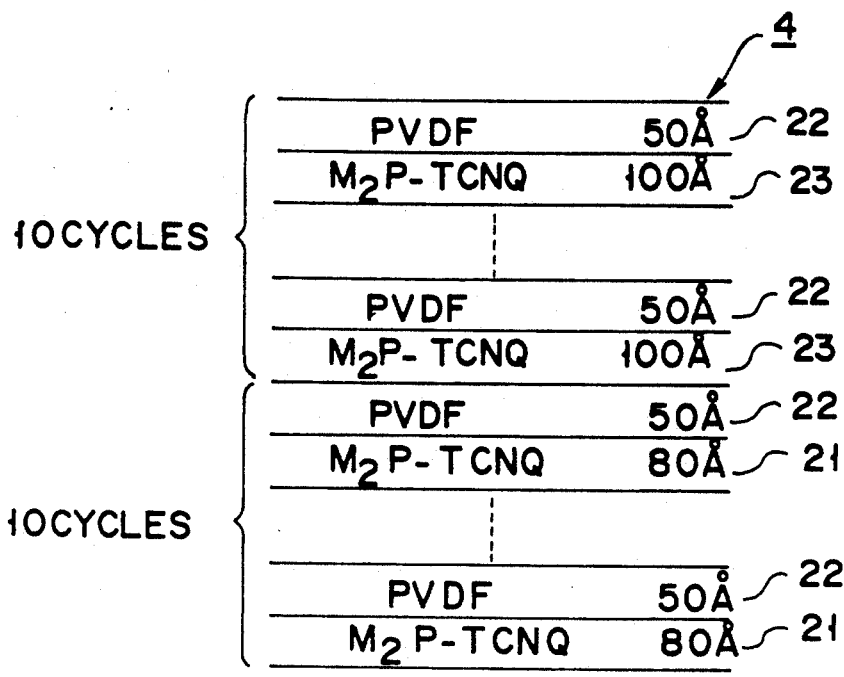
FIG. 4 is a schematic showing the organic thin film layer constituting the display element in Example 2 of the present invention.

For the multivalued (multicolor) display element in this example, the organic thin film layer 4 in FIG. 2 consists of a superlattice made by repeatedly laminating an $M_2P$-TCNQ thin film 21 with the thickness of 80Å and a polyvinylidene fluoride (PVDF) thin film 22 with the thickness of 50Å by turns up to 10 cycles, and a superlattice made by repeatedly laminating an MP-TCNQ thin film 23 with the thickness of 100Å and a polyvinylidene fluoride (PVDF) thin film 22 with the thickness of 50Å by turns up to 10 cycles, as shown in FIG. 4.

The element shows the following colors according to the applied voltage $V_{ap}$.

Light yellow for $V_{ap} < 5V$
Light black purple for $5V \leq V_{ap} \geq 8V$
Dark black purple for $V_{ap} > 8V$.

Example 3 (Display Element)

Figure 5:
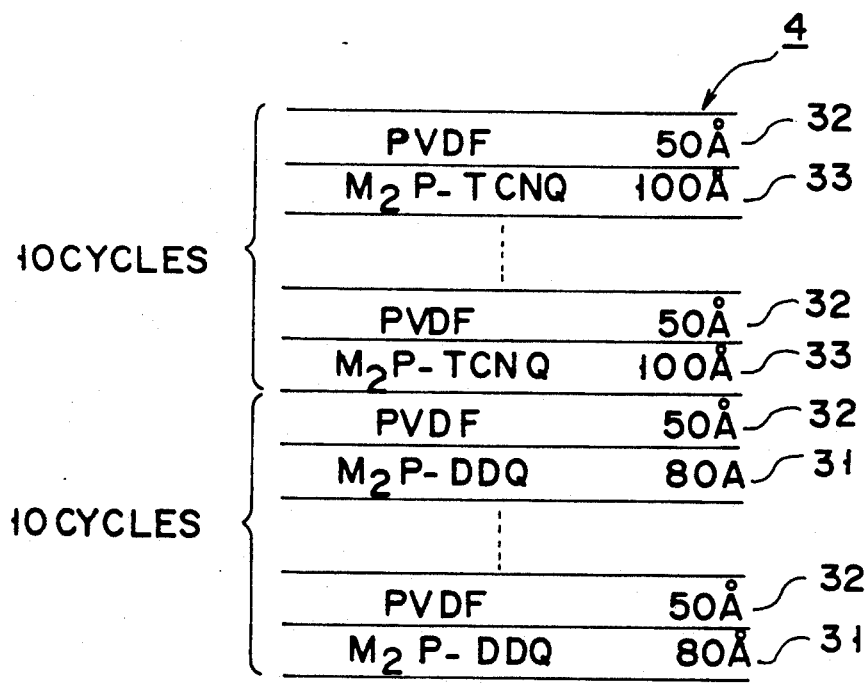
FIG. 5 is a schematic showing the organic thin film layer constituting the display element in Example 3 of the present invention.

For the multivalued (multicolor) display element in this example, the organic thin film layer 4 in FIG. 2 consists of a superlattice made by repeatedly laminating an $M_2P$-DDQ thin film 31 with the thickness of 80Å and a polyvinylidene fluoride (PVDF) thin film 3 with the thickness of 50Å by turns up to 10 cycles, and a superlattice made by repeatedly laminating an $M_2P$-TCNQ thin film 32 with the thickness of 100Å and a polyvinylidene fluoride (PVDF) thin film 33 with the thickness of 50Å by turns up to 10 cycles, as shown in FIG. 5.

The element shows the following colors according to the applied voltage $V_{ap}$.

Yellow for $V_{ap} < 5V$.
Blue for $5V \leq V_{ap} \leq 8V$.
Dark blue green for $V_{ap} > 8V$.

Example 4 (Display Element)

For the multivalued (multicolor) display element in this example, the organic thin film layer 4 in FIG. 2 consists of a superlattice made by repeatedly laminating a PZ-TCNQ thin film 41 with the thickness of 100Å and a DAD-TCNQ thin film 42 with the thickness of 100Å by turns up to 10 cycles, a polyvinylidene fluoride (PVDF) thin film 43 with the thickness of 100Å, and a superlattice made by repeatedly laminating a PTZ-TCNQ thin film 44 with the thickness of 100Å, and an $M_2P$-TCNQ thin film 45 with the thickness of 100Å by turns up to 10 cycles, as shown in FIG. 6.

The element shows the following colors according to the applied voltage $V_{ap}$.

Red for $V_{ap} < 5V$.
Green for $5V \leq V \leq 8V$.
Black for $V_{ap} > 8V$.

Examples 5-6 (FET)

FIG. 7 is a sectional view of the basic structure of the n-channel MOSFET related to the present invention.

An n-type source and drain regions 52 and 53 are formed on a p-type silicon substrate 51. A gate oxide film 54 consisting of a thermal oxide film with the thickness of about 100Å, an organic thin film layer 55 and a gate electrode 56 is formed on the channel between the source and drain regions 52 and 53. Source and drain electrodes 57 and 58 are formed on the source and drain regions 52 and 53.

Example 5 (FET)

In this example, the organic thin film layer 55 in FIG. 7 consists of an $M_2P$-TCNQ thin film 61 with the thickness of 80Å, a PVDF thin film 62 with the thickness of 50Å, an $M_2P$-TCNQ thin film 63 with the thickness of 100Å, and a PVDF thin film 62 with the thickness of 50Å, as shown in FIG. 8. These layers are formed by the vacuum deposition method.

Figure 10:
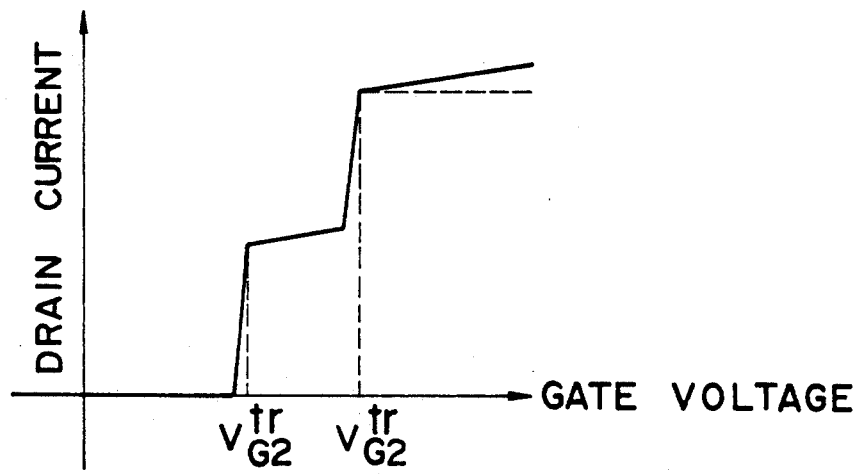
FIG. 10 is a diagram showing the relationship between the gate voltage and drain current of the FET in Examples 5 and 6 of the present invention.

The source-drain current of this element suddenly increases and the element shows the multiple-stage switching function when the gate voltage reaches 1.5V ($V_G^{1tr}$) and 2.1($V_G^{2tr}$), as shown in FIG. 10.

Example 6 (FET)

Figure 9:
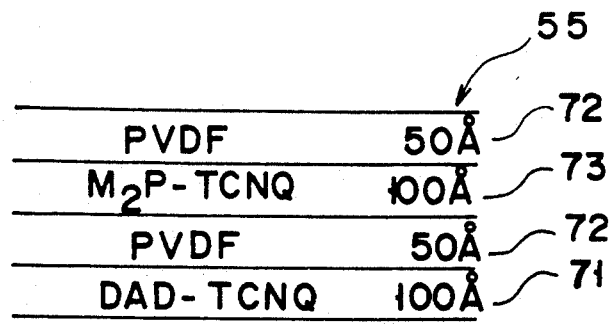
FIG. 9 is a schematic showing the organic thin film layer constituting the FET in Example 6 of the present invention.

In this example, the organic thin film layer 55 in FIG. 7 consists of an DAD-TCNQ thin film 71 with the thickness of 100Å, a PVDF thin film 72 with the thickness of 50Å, an $M_2P$-TCNQ thin film 73 with the thickness of 100Å, and a PVDF thin film 72 with the thickness of 50Å, as shown in FIG. 9. These layers are formed by the vacuum deposition method.

The source-drain current of this element suddenly increases and the element shows the multiple-stage switching function when the gate voltage reaches 1.5V ($V_G^{1tr}$) and 1.8V ($V_G^{2tr}$), as shown in FIG. 10.

Example 7 (Pyroelectric Element)

Figure 11:
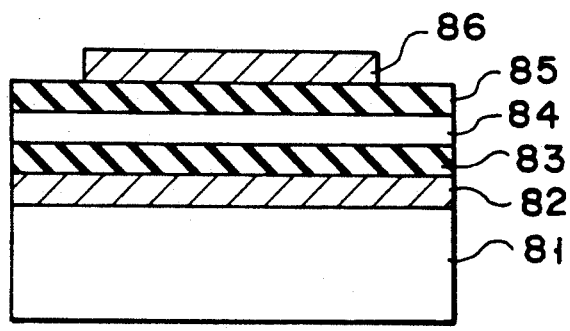
FIG. 11 is a schematic showing the basic structure of the pyroelectric element in Example 7 of the present invention.

FIG. 11 is sectional view of the basic structure of the pyroelectric element related to the present invention. An Al electrode 82, a polyisobutylmethacrylate (PiBMA) thin film with the thickness of 200Å, a complex thin film 84 with the thickness of 100Å, PiBMA thin film 85 with the thickness of 200Å, and a nichrome electrode 86 are formed in order on a glass substrate 81.

The pyroelectric elements are manufactured by using the charge-transfer complexes shown in Table 1 which are ionic under the bulk state to constitute the complex thin film 84. For comparison, a pyroelectric element is manufactured by using conventionally-used polyvinylidene fluoride (PVDF) or $BaTiO_2$ instead of the complex thin film 84.

While polarizing the complex thin film 84, the total quantity of charge accumulated on the electrode surface is measured by a charge detector in the temperature range between $-80°$ C. to $300°$ C. controlled by a temperature controller. And the pyroelectric coefficients of these pyroelectric elements are calculated. Table 1 shows the results.

From Table 1, it is found that the pyroelectric coefficients p of the pyroelectric elements in the examples 7-1 to 7-7 are equal to or larger than the value obtained by using PVDF showing the largest value among organic macromolecules. In addition, because the charge transfer absorption of each complex is in the infrared region, it is possible to manufacture a pyroelectric element sensing only a certain wavelength.

TABLE 1

| | Material | CT absorption (μm) | pyroelectric coefficient p [μC/m²K] |
|---|---|---|---|
| Examples | | | |
| 7-1 | DAD-TCNQ | 0.98 | 30 |
| 7-2 | DAD-DMeTCNQ | 0.80 | 80 |
| 7-3 | DAD-CA | 1.10 | 10 |
| 7-4 | TMPD-TCNQ | 0.80 | 180 |
| 7-5 | TMPD-CA | 1.08 | 50 |
| 7-6 | N-MePTZTCNQ | 1.50 | 40 |

TABLE 1-continued

| | Material | CT absorption (μm) | pyroelectric coefficient p [μC/m²K] |
|---|---|---|---|
| 7-7 | TMB-DDQ | 1.0 | 1 |
| Comparative Examples | | | |
| 7-8 | PVDF | | 30 |
| 7-9 | BaTiO$_2$ | | 200 |

Example 8 (Optical Recording Element)

Figure 12:
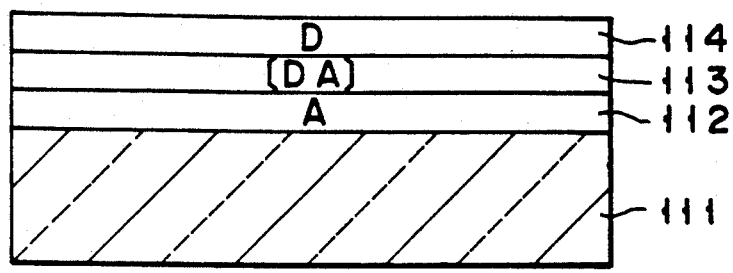
FIG. 12 is a schematic of the optical recording element in Example 8 of the present invention.

FIG. 12 is a sectional view of the optical recording element of this example. As shown in FIG. 12, a recording unit consisting of a three-layered structure is formed on a glass substrate 111 by laminating a DDQ thin film with the thickness of 300Å as a A-molecule thin film 112, MP-TCNQ complex thin film with the thickness of 100Å as a complex thin film 113, and a tetraazaannulenenickel complex thin film with the thickness of 200Å as a D-molecule thin film 114.

Information is written in the optical recording element by applying a laser beam with the absorption wavelength of 460 nm specific to the tetraazaannulenenickel complex of the D-molecule from an optical system under the conditions of the spot diameter of 5 gm and the output of 100 mW. In this case, the information is held because the D-molecule is optically excited, electrons move to the A-molecule thin film through the complex thin film, and D and A molecules are ionized.

For the ionic M$_2$P-TCNQ complex, absorption is observed at the wavelength of 750 nm. For the neutral M$_2$P-TCNQ complex, however, no absorption is observed at the wavelength of 750 nm. The reference beam with the output of 0.2 mW adjusted so that the light intensity distribution will be present only at the wavelength between 700 to 800 nm by passing white light through a band filter, is applied the recorded element. The intensity of the transmitted light at the wavelength of 750 nm is amplified and detected. And the intensities of the transmitted light from the recorded portion and from the non-recorded portion are compared. As the result, the intensity change of signal $\Delta T_s$ is detected which is much larger than of noise level $\Delta T_n$.

Example 9 (Multiple Optical Recording Element)

Figure 13:
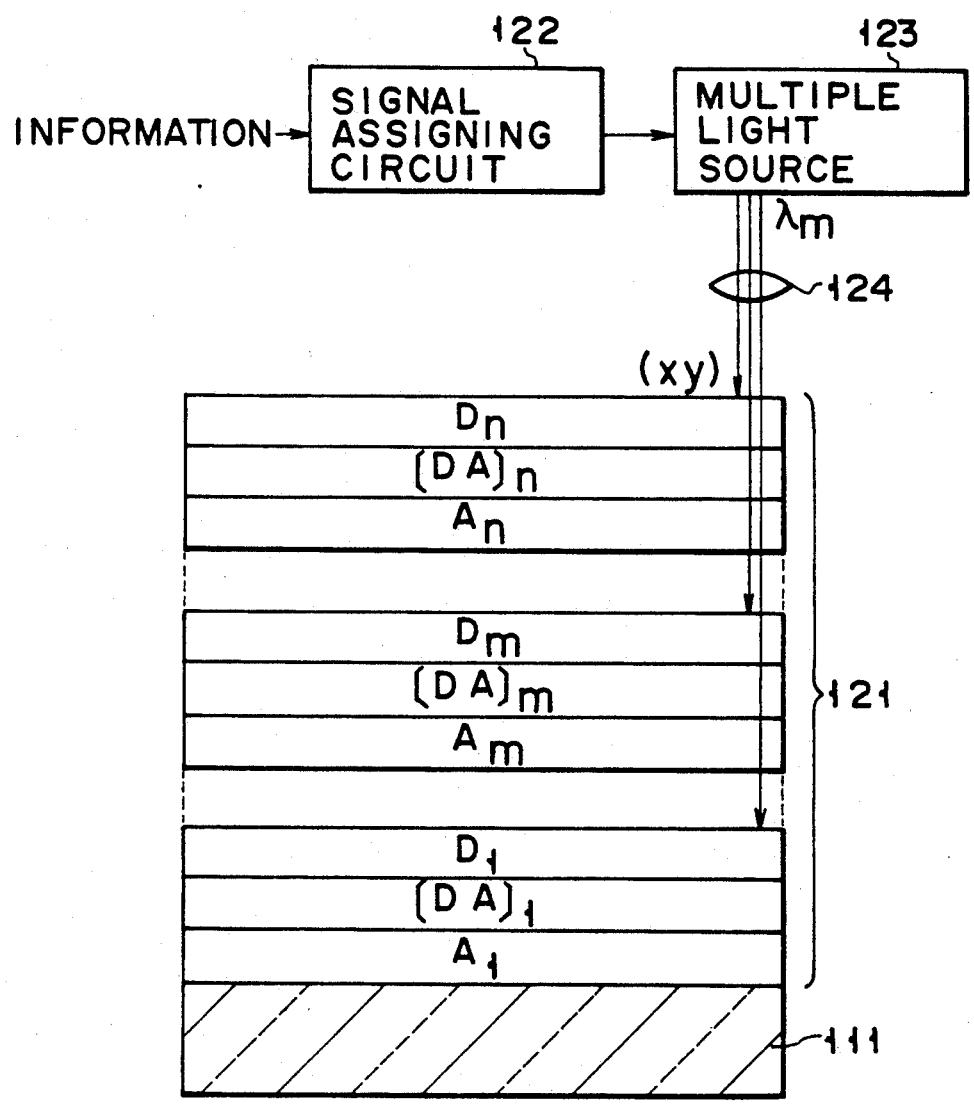
FIG. 13 is a schematic showing the method for recording information in the multiple-optical recording element in Example 9 of the present invention.
Figure 14:
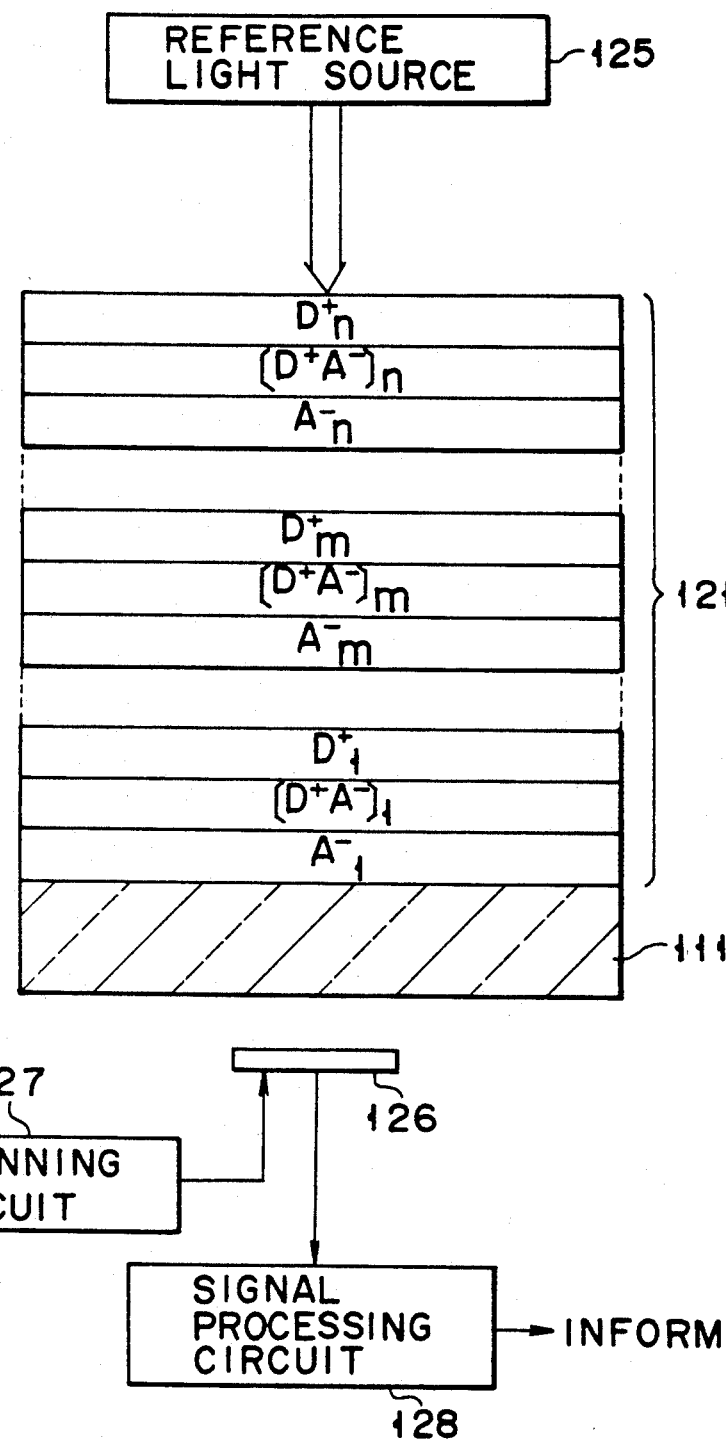
FIG. 14 is a schematic showing the method for reading information from the multiple-optical recording element in the Example 9 of the present invention.

FIG. 13 is a schematic showing how to record information in the multiple optical recording element related to the present invention, and FIG. 14 is a schematic showing how to read information from the recording element.

As shown in FIG. 13, a multiple optical recording element 121 is formed by laminating recording units each consisting of a three-layered structure of $D_m$/[DA]$_m$/A$_m$ (combination of component molecules differs in the recording units) by n stages on a glass substrate 111. $D_m$ (m ranges between 1 and n) molecule constituting each recording unit specifically senses the light with wave-length of $\lambda_m$ (m ranges between 1 and n). Information is assigned to each light source for emitting the light with the wavelength of $\lambda_m$ (m ranges between 1 and n) constituting a multiple light source 123 by a signal assigning circuit 122 and on/off of each light source is controlled. The light corresponding to information is applied to the recording portion (xy) of the multiple optical recording element 121 through an optical system 124. At the recording portion (xy), D molecule of the recording unit sensing the applied light is excited, electrons move to A molecule through a neutral [DA] thin film, D and A molecules are ionized, and the complex is ionized by these polarized fields. Thus, information is recorded in the recording portion (xy) for each layer where each recording unit is formed.

As shown in FIG. 14, information is held in the recording unit where is recorded under the condition of $[D^+A^-]_m$ (m ranges between 1 and n) which is realized as the result of transition of complexes from neutral to ionic state. Each ionic $[D^+A^-]_m$ complex has an absorption $\lambda'_m$ (m ranges between 1 and n) at the long wavelength side. Reference beam with a wide wavelength range and a low output is emitted from a reference light source 125. The information in the recording unit can simultaneously be read in parallel by a scanning-type spectrophotometer 126 installed under the multiple optical recording element 121 and scanned by a scanning circuit 127. And it is possible to convert the information equivalent to the original information by a signal processing circuit 128.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An organic thin film element comprising an organic thin film consisting of a mixed stacked charge-transfer complex of donor and acceptor organic molecules, wherein said organic thin film is made neutral by forming said mixed stacked charge-transfer complex which is ionic under the bulk state into a thin film, wherein said organic thin film has a thickness of 200Å or less.

2. The element according to claim 1, wherein a plurality of organic thin films are laminated with interposing another organic thin film therebetween to form a superlattice structure.

3. The element according to claim 2, wherein a plurality of organic thin film layers have two or more different thicknesses.

4. The element according to claim 2, wherein a plurality of organic thin film layers consist of two or more different mixed stacked charge-transfer complexes.

5. The element according to claim 2, wherein a plurality of organic thin films are laminated with an interposing insulating layer therebetween to form a superlattice structure 6. The element according to claim 2, wherein a plurality of organic thin films are laminated with an interposing mixed stacked charge-transfer complex which is neutral under the bulk state therebetween to form a superlattice structure.

7. The element according to claim 2, wherein a plurality of organic thin film layers are laminated with an interposing donor or acceptor molecule therebetween to form a superlattice structure.

8. The element according to claim 2, further comprising an insulating layer and electrode at both sides of a superlattice structure including an organic thin film, and used for a display element.

9. The element according to claim 2, further comprising a silicon substrate;

source and drain regions formed on the silicon substrate;

a gate insulating film formed on a channel between said source and drain regions;

a superlattice structure including an organic thin film, which is formed on the gate insulating film;

a gate electrode formed on the superlattice structure; and used for a field-effect transistor.

10. The element according to claim 1, further comprising an insulating layer and electrode at both sides of said organic thin film, and used for a pyroelectric element for detecting the temperature change in the state of the organic thin film being polarized.

11. An organic thin film element according to claim 1, further comprising a recording unit having a three-layered structure formed by laminating films made of donor and acceptor molecules at both sides of said organic thin film, and used for an optical recording element.

12. The element according to claim 11, further comprising a plurality of recording units having a three-layered structure with different combinations of the donor molecule, the organic thin film, and the acceptor molecule, and used for a multiple optical recording element.

* * * * *